(12) United States Patent
Yamoto et al.

(10) Patent No.: US 11,873,356 B2
(45) Date of Patent: Jan. 16, 2024

(54) CURABLE COMPOSITION AND CURED PRODUCT THEREOF

(71) Applicant: DIC Corporation, Tokyo (JP)

(72) Inventors: Kazuhisa Yamoto, Ichihara (JP); Yutaka Satou, Ichihara (JP); Koji Hayashi, Ichihara (JP)

(73) Assignee: DIC Corporation, Tokyo (JP)

( * ) Notice: Subject to any disclaimer, the term of this patent is extended or adjusted under 35 U.S.C. 154(b) by 692 days.

(21) Appl. No.: 17/041,776

(22) PCT Filed: Mar. 14, 2019

(86) PCT No.: PCT/JP2019/010505
§ 371 (c)(1),
(2) Date: Sep. 25, 2020

(87) PCT Pub. No.: WO2019/188332
PCT Pub. Date: Oct. 3, 2019

(65) Prior Publication Data
US 2021/0032383 A1 Feb. 4, 2021

(30) Foreign Application Priority Data

Mar. 29, 2018 (JP) ................................ 2018-064717

(51) Int. Cl.
*C08G 73/10* (2006.01)
*C08F 212/14* (2006.01)
*H01L 23/29* (2006.01)
*H05K 1/03* (2006.01)

(52) U.S. Cl.
CPC ............ *C08F 212/22* (2020.02); *C08G 73/10* (2013.01); *H01L 23/29* (2013.01); *H05K 1/03* (2013.01)

(58) Field of Classification Search
CPC ........ C08F 212/22; C08F 222/40; C08G 73/10
See application file for complete search history.

(56) References Cited

U.S. PATENT DOCUMENTS

| | | | |
|---|---|---|---|
| 2005/0003199 A1 | 1/2005 | Takaya et al. | |
| 2020/0062903 A1* | 2/2020 | Gu | ............ C08G 73/12 |

FOREIGN PATENT DOCUMENTS

| | | | | |
|---|---|---|---|---|
| CN | 106700073 A | | 5/2017 | |
| CN | 106977717 A | * | 7/2017 | ........... C08G 73/123 |
| EP | 0489691 A2 | * | 5/1990 | |
| EP | 0489691 A2 | | 6/1992 | |
| JP | H04-8444 B2 | | 2/1992 | |
| JP | H05-9236 A | | 1/1993 | |
| JP | 2002-012650 A | | 1/2002 | |
| JP | 2004-210936 A | | 7/2004 | |
| JP | 2010-090238 A | | 4/2010 | |
| JP | 2016-074849 A | | 5/2016 | |
| JP | 2016-156019 A | | 9/2016 | |
| WO | 2018/008415 A1 | | 1/2018 | |
| WO | WO-2018098832 A1 | * | 6/2018 | ............. C08G 73/10 |

OTHER PUBLICATIONS

Haoyu et al. Polymer 50 (2009) 1414-1422 (Year: 2009).*
Varma et al. Die Angewandte Makromolekulare Chemie 184, 7-18 (Year: 1991).*
International Search Report dated Jun. 18, 2019, issued for PCT/JP2019/010505.

* cited by examiner

*Primary Examiner* — Mark S Kaucher
(74) *Attorney, Agent, or Firm* — Locke Lord LLP; James E. Armstrong, IV

(57) ABSTRACT

A curable composition to be cured to a cured product excellent in heat resistance and dielectric properties, a cured product of the curable composition, a printed wiring board, a semiconductor sealing material, and a build-up film. There is a curable composition containing an aromatic ester compound (A) and a maleimide compound (B), the aromatic ester compound (A) being represented by structural formula (1) (where in the formula, $Ar^1$ is a substituted or unsubstituted aromatic ring group, each $R^1$ is a polymerizable unsaturated bond-containing substituent, each 1 is 0 or 1, each $R^2$ is any of an alkyl group, an alkoxy group, an alkyloxycarbonyl group, an alkylcarbonyloxy group, and a halogen atom, each m is 0 or an integer of 1 to 5, and n is 2 or 3, provided that at least one polymerizable unsaturated bond-containing substituent is contained in one molecule as a substituent on $Ar^1$ or as $R^1$).

5 Claims, No Drawings

CURABLE COMPOSITION AND CURED PRODUCT THEREOF

TECHNICAL FIELD

The present invention relates to a curable composition to be cured to provide a cured product excellent in heat resistance and dielectric properties, a cured product of the curable composition, a printed wiring board, a semiconductor sealing material, and a build-up film obtained using the curable composition.

BACKGROUND ART

In recent years, electronic devices have been reduced in size and increased in performance, and accordingly, various materials used have been required to have higher performance. For example, in semiconductor package substrates, higher speeds and higher frequencies of signals are used, and materials having low electrical energy losses, i.e., low dielectric loss tangents, are required.

As such a material having a low dielectric loss tangent, for example, an invention relating to a resin composition containing (A) an epoxy resin, (B) an active ester compound, (C) a smear-suppressing component, and (D) an inorganic filler is provided (for example, see Patent Literature 1). In this case, the resin composition is characterized in that predetermined amounts of the active ester compound (B), the smear-suppressing component (C), and the inorganic filler (D) are contained based on 100% by mass of a non-volatile component in the resin composition and that the smear-suppressing component (C) is formed of rubber particles.

Patent Literature 1 states that a cured product obtained from the resin composition can achieve a low dielectric loss tangent. It is also stated that a smear (resin residue) in a via hole after the cured product is subjected to drilling processing and then roughing treatment can be reduced.

It is also stated that the active ester compound (B) described in Patent Literature 1 is a compound that has one or more active ester groups in one molecule and that reduces the dielectric loss tangent of the cured product of the resin composition.

CITATION LIST

Patent Literature

PTL 1: Japanese Unexamined Patent Application Publication No. 2016-156019

SUMMARY OF INVENTION

Technical Problem

Patent Literature 1 states that the use of the active ester compound enables a reduction in the dielectric loss tangent of a cured product to be obtained. However, it has been found that such a cured product may not always have sufficient heat resistance.

Solution to Problem

The inventors have conducted intensive studies to solve the foregoing problems and have found that a curable composition containing an aromatic ester compound having a specific molecular structure and a maleimide compound provides a cured product significantly excellent in heat resistance and dielectric properties. This finding has led to the completion of the present invention.

That is, the present invention provides a curable composition containing an aromatic ester compound (A) and a maleimide compound (B), the aromatic ester compound (A) being represented by structural formula (1):

[Chem. 1]

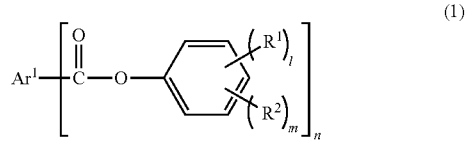

(where in the formula, $Ar^1$ is a substituted or unsubstituted aromatic ring group, each $R^1$ is a polymerizable unsaturated bond-containing substituent, each l is 0 or 1, each $R^2$ is any of an alkyl group, an alkoxy group, an alkyloxycarbonyl group, an alkylcarbonyloxy group, and a halogen atom, each m is 0 or an integer of 1 to 5, and n is 2 or 3, provided that at least one polymerizable unsaturated bond-containing substituent is contained in one molecule as a substituent on $Ar^1$ or as $R^1$), a cured product thereof, a printed wiring board, a semiconductor sealing material, and a build-up film obtained using the curable composition.

Advantageous Effects of Invention

According to the present invention, a curable composition to be cured to provide a cured product excellent in heat resistance and dielectric properties, a cured product obtained from the curable composition, a printed wiring board, a semiconductor sealing material, and a build-up film obtained using the curable composition.

DESCRIPTION OF EMBODIMENTS

Embodiments for carrying out the present invention will be described in detail below.

The aromatic ester compound (A) used in the present invention is represented by structural formula (1):

[Chem. 2]

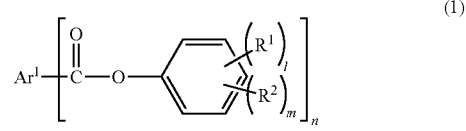

(where in the formula, $Ar^1$ is a substituted or unsubstituted aromatic ring group, each $R^1$ is a polymerizable unsaturated bond-containing substituent, each l is 0 or 1, each $R^2$ is any of an alkyl group, an alkoxy group, an alkyloxycarbonyl group, an alkylcarbonyloxy group, and a halogen atom, each m is 0 or an integer of 1 to 5, and n is 2 or 3, provided that at least one polymerizable unsaturated bond-containing substituent is contained in one molecule as a substituent on $Ar^1$ or as $R^1$).

Preferably, the aromatic ester compound (A) is a liquid at ordinary temperature (25° C.) or has a softening point in the range of 40° C. to 200° C., from the viewpoint of achieving better handleability when adjusted as a curable composition described below, and a better balance between the heat resistance and the dielectric properties of a cured product thereof.

$Ar^1$ in structural formula (1) is a substituted or unsubstituted aromatic ring group preferably having 3 to 30 carbon atoms. n in structural formula (1) is 2 or 3; thus, two or three hydrogen atoms of the aromatic ring of the aromatic ring group are each replaced with the structural moiety in the brackets in structural formula (1).

Examples of the aromatic ring group include, but are not particularly limited to, a group in which two or three hydrogen atoms are removed from an aromatic compound, such as a group in which two or three hydrogen atoms are removed from a monocyclic aromatic compound, e.g., benzene, furan, pyrrole, thiophene, imidazole, pyrazole, oxazole, isoxazole, thiazole, isothiazole, pyridine, pyrimidine, pyridazine, pyrazine, or triazine, and a group in which two or three hydrogen atoms are removed from a fused aromatic compound, e.g., naphthalene, anthracene, phenalene, phenanthrene, quinoline, isoquinoline, quinazoline, phthalazine, pteridine, coumarin, indole, benzimidazole, benzofuran, or acridine. Additionally, the aromatic ring group may be obtained from a combination of two or more of these aromatic compounds. Examples thereof include a group in which two or three hydrogen atoms are removed from an aromatic ring assembly compound, such as biphenyl, binaphthalene, bipyridine, bithiophene, phenylpyridine, phenylthiophene, terphenyl, diphenylthiophene, or quaterphenyl; and a group in which two or three hydrogen atoms are removed from an aromatic compound linked with an alkylene, such as diphenylmethane, diphenylethane, 1,1-diphenylethane, 2,2-diphenylpropane, naphthylphenylmethane, triphenylmethane, dinaphthylmethane, dinaphthylpropane, phenylpyridylmethane, fluorene, or diphenylcyclopentane.

Among these, $Ar^1$ is preferably a group in which two or three hydrogen atoms are removed from a substituted or unsubstituted benzene ring or naphthalene ring, more preferably a group in which two or three hydrogen atoms are removed from a substituted or unsubstituted benzene ring, because a cured product having better dielectric properties is obtained.

$Ar^1$, the aromatic ring group, may have a substituent. The "substituent on the aromatic ring group" refers to a group that substitutes for at least one hydrogen atom of the aromatic ring of the aromatic ring group. Specific examples of the substituent on the aromatic ring group include, but are not particularly limited to, alkyl groups, alkoxy groups, alkyloxycarbonyl groups, alkylcarbonyloxy groups, and a halogen atom.

Examples of the alkyl groups include, but are not particularly limited to, a methyl group, an ethyl group, a propyl group, an isopropyl group, a n-butyl group, an isobutyl group, a sec-butyl group, a tert-butyl group, a n-pentyl group, an isopentyl group, a tert-pentyl group, a neopentyl group, a 1,2-dimethylpropyl group, a n-hexyl group, an isohexyl group, and a cyclohexyl group.

Examples of the alkoxy groups include, but are not particularly limited to, a methoxy group, an ethoxy group, a propoxy group, an isopropoxy group, a butoxy group, a pentyloxy group, and a hexyloxy group.

Examples of the alkyloxycarbonyl groups include, but are not particularly limited to, a methyloxycarbonyl group, an ethyloxycarbonyl group, a propyloxycarbonyl group, an isopropyloxycarbonyl group, a butyloxycarbonyl group, a n-butyloxycarbonyl group, an isobutyloxycarbonyl group, a sec-butyloxycarbonyl group, and a tert-butyloxycarbonyl group.

Examples of the alkylcarbonyloxy groups include, but are not particularly limited to, a methylcarbonyloxy group, an ethylcarbonyloxy group, a propylcarbonyloxy group, an isopropylcarbonyloxy group, a butylcarbonyloxy group, a n-butylcarbonyloxy group, an isobutylcarbonyloxy group, a sec-butylcarbonyloxy group, and a tert-butylcarbonyloxy group.

Examples of the halogen atom include a fluorine atom, a chlorine atom, a bromine atom, and an iodine atom.

In an embodiment of the present invention, $Ar^1$ may have a polymerizable unsaturated bond-containing substituent. Specific examples of the polymerizable unsaturated bond-containing substituent include alkenyl groups and alkynyl groups.

Examples of the alkenyl groups include, but are not particularly limited to, a vinyl group, an allyl group, a propenyl group, an isopropenyl group, a 1-propenyl group, a 1-butenyl group, a 2-butenyl group, a 3-butenyl group, a 1-hexenyl group, a 2-hexenyl group, a 3-hexenyl group, a 4-hexenyl group, a 5-hexenyl group, a 1-octenyl group, a 2-octenyl group, a 1-undecenyl group, a 1-pentaundecenyl group, a 3-pentadecenyl group, a 7-pentadecenyl group, a 1-octadecenyl group, a 2-octadecenyl group, a cyclopentenyl group, a cyclohexenyl group, a cyclooctenyl group, a 1,3-butadienyl group, a 1,4-butadienyl group, a hexa-1,3-dienyl group, a hexa-2,5-dienyl group, a pentadeca-4,7-dienyl group, a hexa-1,3,5-trienyl group, and a pentadeca-1,4,7-trienyl group.

Examples of the alkynyl groups include, but are not particularly limited to, an ethynyl group, a propargyl group, a 1-butynyl group, a 2-butynyl group, a 3-butynyl group, a 3-pentynyl group, a 4-pentynyl group, and a 1,3-butadiynyl group.

The polymerizable unsaturated bond-containing substituent may further have a substituent. The "substituent on the polymerizable unsaturated bond-containing substituent" refers to a group that substitutes for at least one hydrogen atom of the polymerizable unsaturated bond-containing substituent. Specific examples of the substituent on the polymerizable unsaturated bond-containing substituent include alkyloxycarbonyl groups, alkylcarbonyloxy groups, and a halogen atom. Examples of the alkyloxycarbonyl groups, the alkylcarbonyloxy groups, and the halogen atom include those described above.

Among these, the polymerizable unsaturated bond-containing substituent is preferably a substituted or unsubstituted alkenyl group having 2 to 30 carbon atoms, more preferably a substituted or unsubstituted alkenyl group having 2 to 10 carbon atoms, still more preferably a substituted or unsubstituted alkenyl group having 2 to 5 carbon atoms, particularly preferably a vinyl group, an allyl group, a propenyl group, an isopropenyl group, a 1-propenyl group, a 1-butenyl group, a 2-butenyl group, a 3-butenyl group, or a 1,3-butadienyl group, most preferably an allyl group, a propenyl group, an isopropenyl group, or a 1-propenyl group.

Preferred examples of the structure of $Ar^1$ include those represented by formulae (2-1) to (2-17) below.

[Chem. 3]

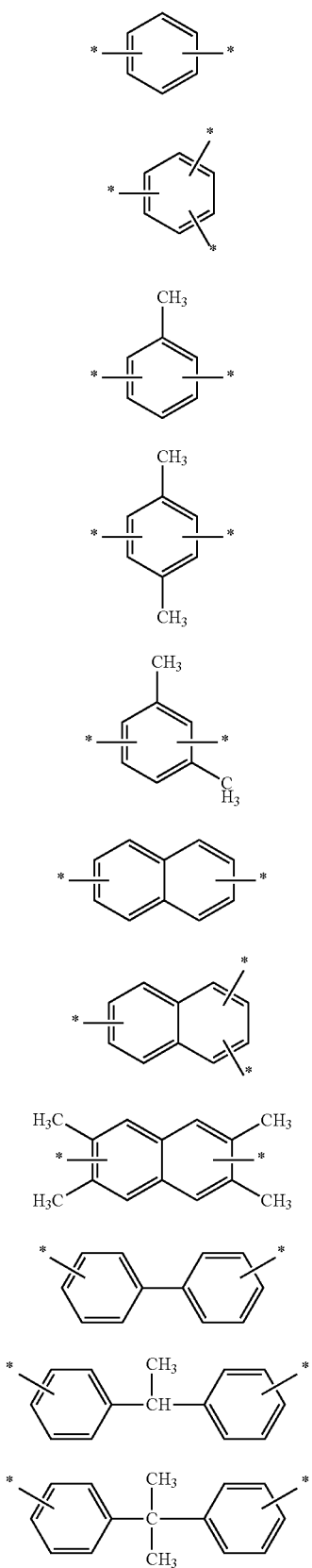

(2-1)
(2-2)
(2-3)
(2-4)
(2-5)
(2-6)
(2-7)
(2-8)
(2-9)
(2-10)
(2-11)

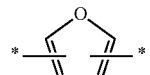
(2-12)

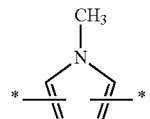
(2-13)

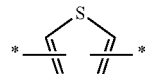
(2-14)

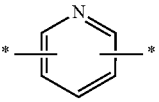
(2-15)

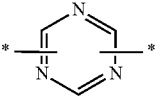
(2-16)

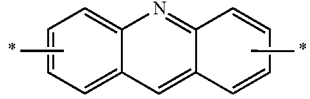
(2-17)

In formulae (2-1) to (2-17), each "*" represents a position where it binds to "—C(O)OAr²". Note that each "-*" may bind to any position of a corresponding one of the aromatic rings.

Among these, $Ar^1$ is preferably represented by any of formulae (2-1) to (2-11), more preferably formulae (2-1), (2-2), (2-6), (2-7), and (2-9), even more preferably formulae (2-1), (2-2), (2-6), and (2-7). From the viewpoints of achieving high handleability and low viscosity of the aromatic ester compound (A), $Ar^1$ is preferably represented by (2-1) or (2-2). From the viewpoints of achieving higher heat resistance and a good balance with low dielectric properties of the resulting cured product, $Ar^1$ is preferably represented by (2-6) or (2-7).

At least one hydrogen atom of the aromatic ring of each of formulae (2-1) to (2-17) may be replaced with the polymerizable unsaturated bond-containing group.

Each $R^1$ in structural formula (1) represents a polymerizable unsaturated bond-containing substituent. Specific examples of the polymerizable unsaturated bond-containing substituent include alkenyl groups and alkynyl groups.

Examples of the alkenyl groups include, but are not particularly limited to, a vinyl group, an allyl group, a propenyl group, an isopropenyl group, a 1-propenyl group, a 1-butenyl group, a 2-butenyl group, a 3-butenyl group, a 1-hexenyl group, a 2-hexenyl group, a 3-hexenyl group, a 4-hexenyl group, a 5-hexenyl group, a 1-octenyl group, a 2-octenyl group, a 1-undecenyl group, a 1-pentaundecenyl group, a 3-pentadecenyl group, a 7-pentadecenyl group, a 1-octadecenyl group, a 2-octadecenyl group, a cyclopentenyl group, a cyclohexenyl group, a cyclooctenyl group, a 1,3-butadienyl group, a 1,4-butadienyl group, a hexa-1,3-dienyl group, a hexa-2,5-dienyl group, a pentadeca-4,7-dienyl group, a hexa-1,3,5-trienyl group, and a pentadeca-1,4,7-trienyl group. Examples of the alkynyl groups include, but are not particularly limited to, an ethynyl group, a propargyl group, a 1-butynyl group, a 2-butynyl group, a 3-butynyl group, a 3-pentynyl group, a 4-pentynyl group, and a 1,3-butadiynyl group.

The polymerizable unsaturated bond-containing substituent may further have a substituent. The "substituent on the polymerizable unsaturated bond-containing substituent" refers to a group that substitutes for at least one hydrogen atom of the polymerizable unsaturated bond-containing substituent. Specific examples of the substituent on the polymerizable unsaturated bond-containing substituent include alkyloxycarbonyl groups, alkylcarbonyloxy groups, and a halogen atom. Examples of the alkyloxycarbonyl groups, the alkylcarbonyloxy groups, and the halogen atom include those described above.

Among these, the polymerizable unsaturated bond-containing substituent is preferably a substituted or unsubstituted alkenyl group having 2 to 30 carbon atoms, more preferably a substituted or unsubstituted alkenyl group having 2 to 10 carbon atoms, still more preferably a substituted or unsubstituted alkenyl group having 2 to 5 carbon atoms, particularly preferably a vinyl group, an allyl group, a propenyl group, an isopropenyl group, a 1-propenyl group, a 1-butenyl group, a 2-butenyl group, a 3-butenyl group, or a 1,3-butadienyl group, most preferably an allyl group, a propenyl group, an isopropenyl group, or a 1-propenyl group.

Each 1 in structural formula (1) is 0 or 1. At least one 1 is preferably 1 in one molecule. In particular, when no polymerizable unsaturated bond-containing substituent is present on $Ar^1$ in structural formula (1), at least one 1 in one molecule is 1. All 1's are particularly preferably 1 because the curable composition has excellent curability and provides a cured product further excellent in heat resistance and dielectric properties.

The substitution position of each $R^1$ in structural formula (1) is not particularly limited. Each $R^1$ may be bonded to any carbon atom of a corresponding one of the benzene rings. In particular, each $R^1$ is preferably bonded to the ortho-position with respect to the carbon atom to which the ($Ar^1COO$) group is bonded because the curable composition provides a cured product further excellent in heat resistance and dielectric properties. That is, the aromatic ester compound (A) is more preferably represented by structural formula (1-1):

[Chem. 4]

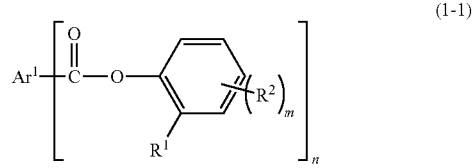

(1-1)

(where in the formula, $Ar^1$ is a substituted or unsubstituted aromatic ring group, each $R^1$ is a polymerizable unsaturated bond-containing substituent, each $R^2$ is any of an alkyl group, an alkoxy group, an alkyloxycarbonyl group, an alkylcarbonyloxy group, a halogen atom, each m is 0 or an integer of 1 to 4, and n is 2 or 3).

Each $R^2$ in structural formula (1) is any of an alkyl group, an alkoxy group, an alkyloxycarbonyl group, an alkylcarbonyloxy group, and a halogen atom. Examples of the alkyl group, the alkoxy group, the alkyloxycarbonyl group, the alkylcarbonyloxy group, and the halogen atom include those described above.

Specific examples of the structure of the aromatic ester compound (A) represented by structural formula (1) include, but are not particularly limited to, compounds represented by chemical formulae (3-1) to (3-32) below.

[Chem. 5]

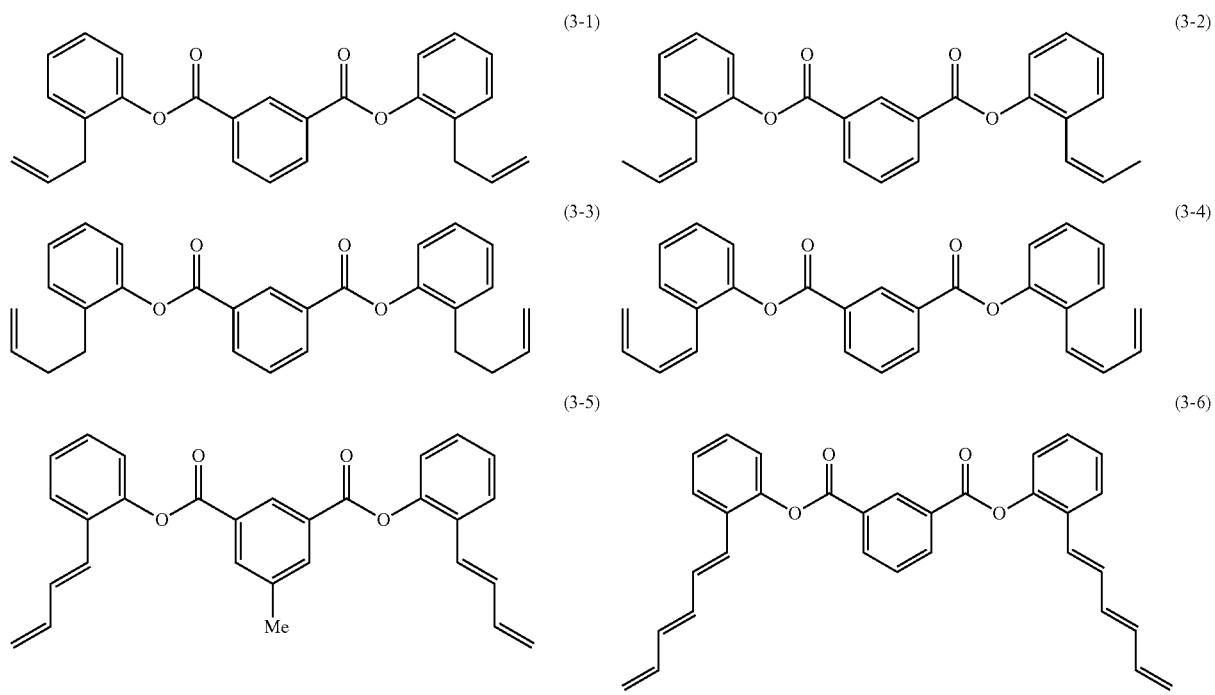

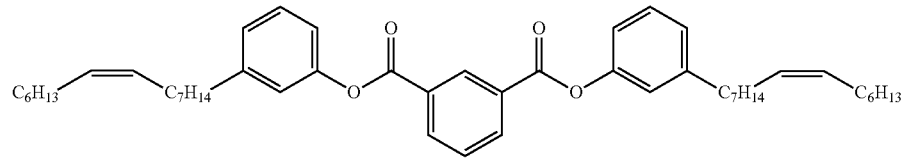
(3-7)
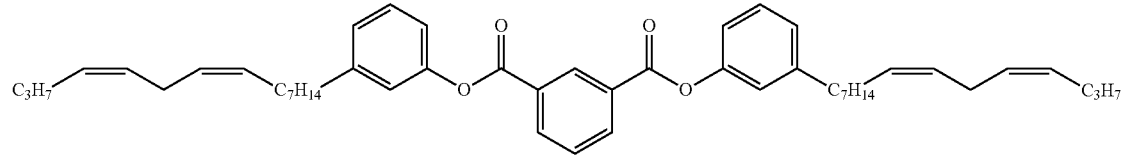
(3-8)
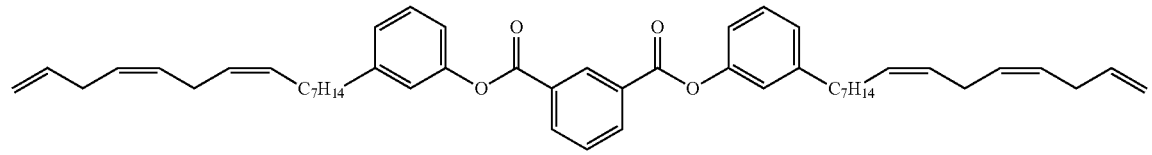
(3-9)
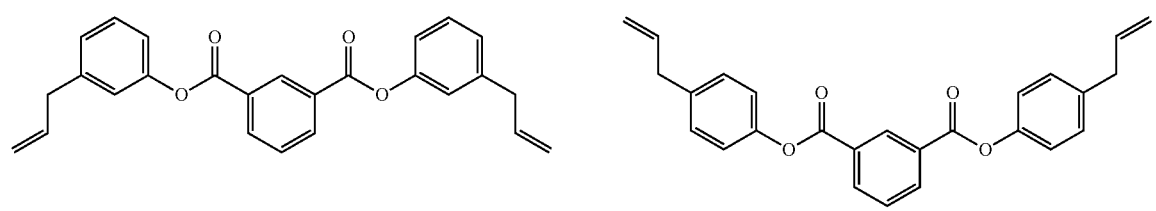
(3-10) (3-11)
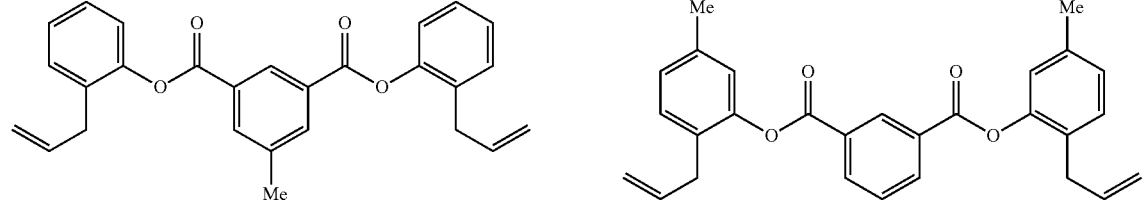
(3-12) (3-13)
[Chem. 6]
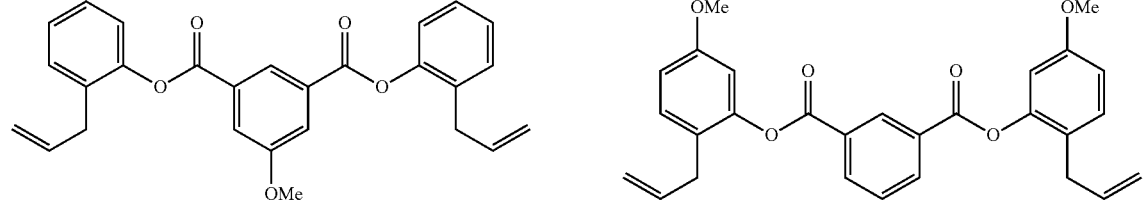
(3-14) (3-15)
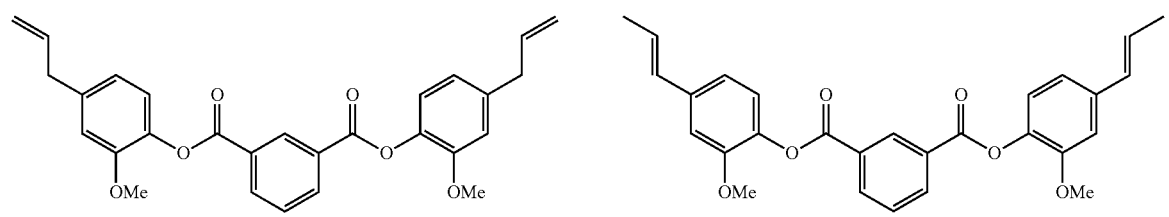
(3-16) (3-17)

-continued
(3-18)
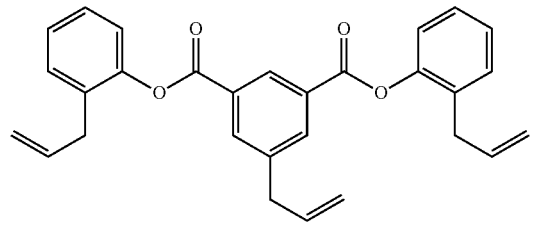
(3-19)
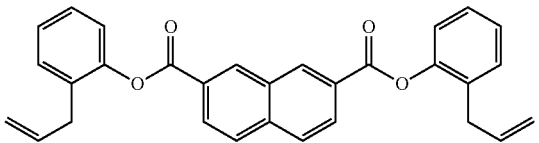
(3-20)
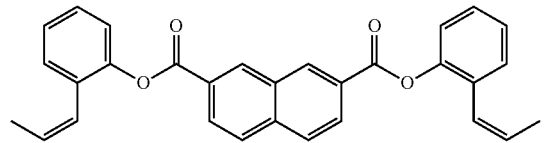
(3-21)
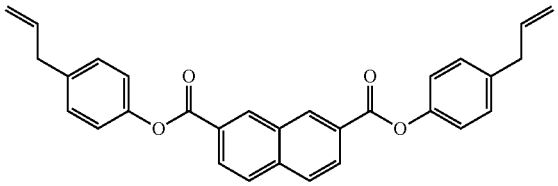
(3-22)
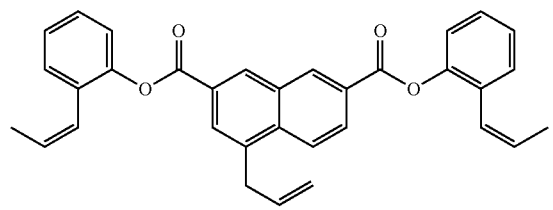
(3-23)
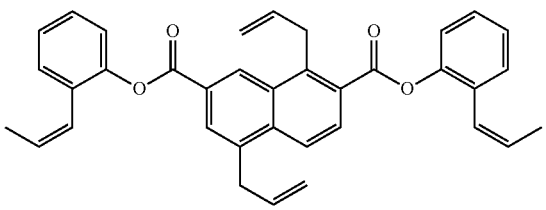
[Chem. 7]
(3-24)
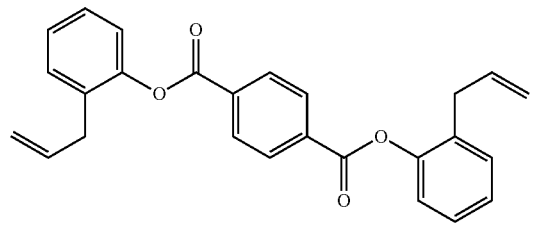
(3-25)
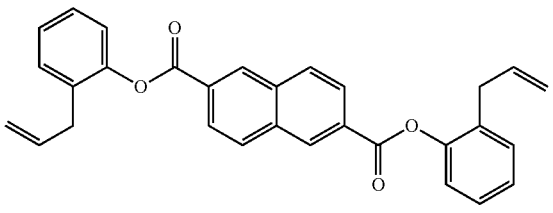
(3-26)
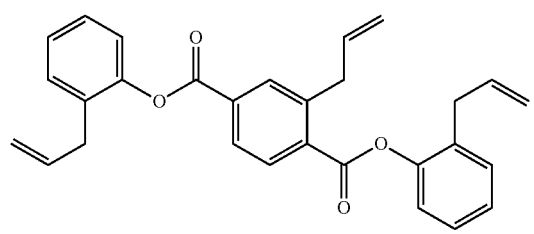
(3-27)
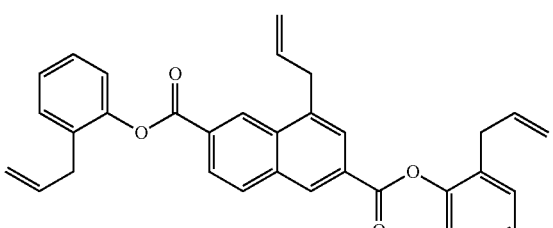
(3-28)
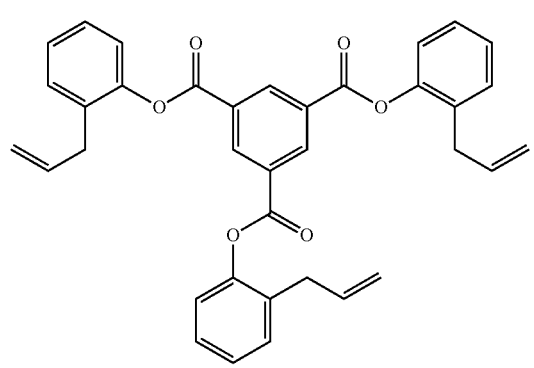
(3-29)
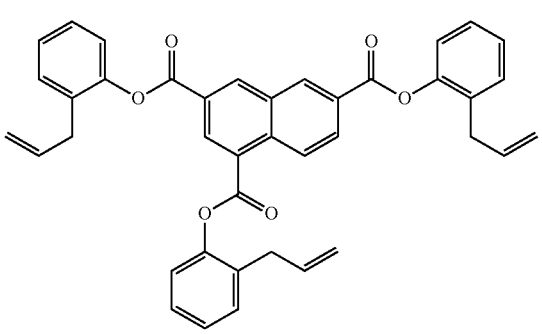

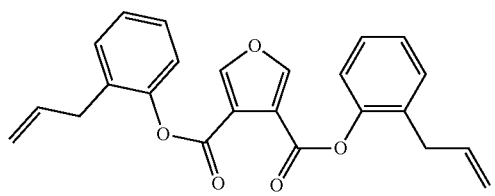

(3-30)

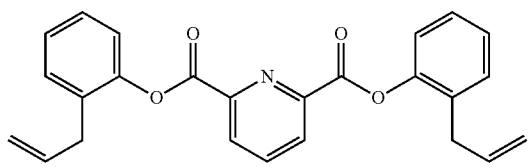

(3-31)

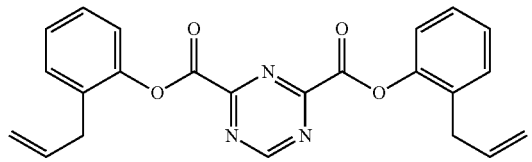

(3-32)

In chemical formulae (3-1) to (3-32), the aromatic ester compound (A) is preferably represented by any of chemical formulae (3-1) to (3-6), (3-12) to (3-15), (3-18) to (3-20), and (3-22) to (3-32), more preferably chemical formulae (3-1) to (3-3), (3-12), (3-13), (3-18) to (3-20), and (3-22) to (3-29), even more preferably chemical formulae (3-1), (3-2), (3-12), (3-13), (3-19), (3-20), (3-24), (3-25), and (3-28), particularly preferably chemical formulae (3-1), (3-2), (3-12), (3-13), and (3-19).

A method for producing the aromatic ester compound (A) is not particularly limited. The aromatic ester compound (A) can be produced by an appropriate known method.

The method according to an embodiment for producing the aromatic ester compound (A) includes a step of reacting a polycarboxylic acid compound having the aromatic ring group represented by $Ar^1$ in structural formula (1) or its derivative with a phenolic compound corresponding to the benzene ring structural moiety in structural formula (1).

(Polycarboxylic Acid Compound or its Derivative) The polycarboxylic acid compound or its derivative has a substituted or unsubstituted aromatic ring group. Examples of the "derivative of the polycarboxylic acid compound" include acid halides of carboxylic acids. The number of carbon atoms in the aromatic ring group is preferably in the range of 3 to 30.

The aromatic ring group and the substituent on the aromatic ring group are the same as those described above.

Specific examples of the polycarboxylic acid compound or its derivative include compounds represented by chemical formulae (4-1) to (4-15) below.

[Chem. 8]

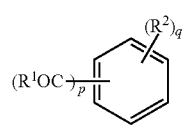

(4-1)

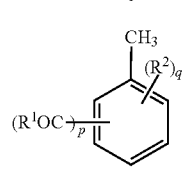

(4-2)

-continued

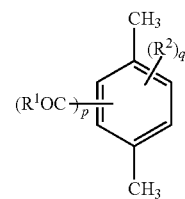

(4-3)

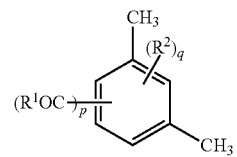

(4-4)

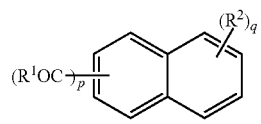

(4-5)

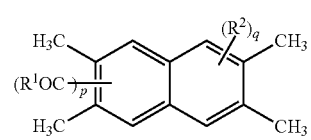

(4-6)

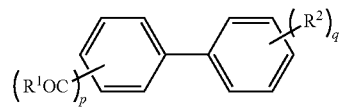

(4-7)

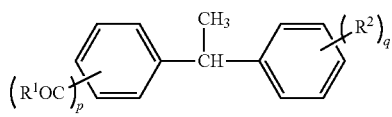

(4-8)

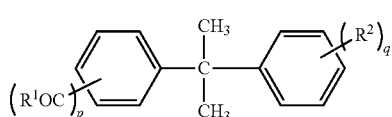

(4-9)

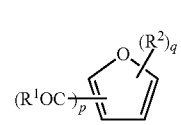

(4-10)

-continued

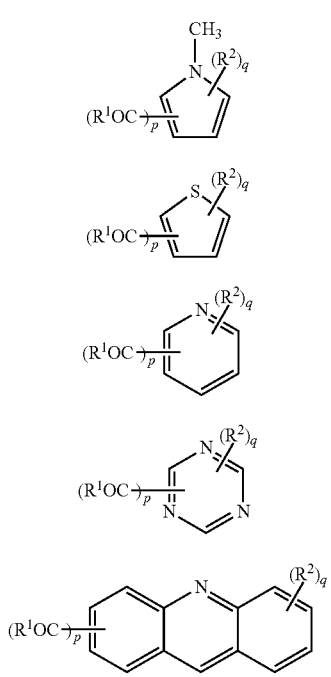

(4-11)
(4-12)
(4-13)
(4-14)
(4-15)

[Chem. 9]

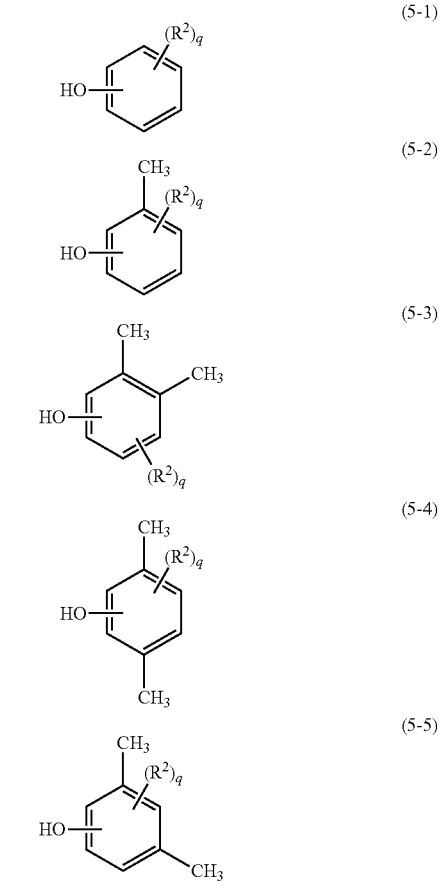

(5-1)
(5-2)
(5-3)
(5-4)
(5-5)

In chemical formulae (4-1) to (4-15), each $R^1$ is a hydroxy group or a halogen atom. Each $R^2$ is a polymerizable unsaturated bond-containing substituent. The polymerizable unsaturated bond-containing substituent is the same as described above. Each p is 2 or 3. Each q is 0 or an integer of 1 or more, preferably 0 or 1 to 3, more preferably 0 or 1, even more preferably 0. The positions of the substituents on the aromatic rings in the foregoing chemical formulae are illustrated on the same aromatic ring for convenience. For example, in chemical formula (4-7) or the like, $R^1OC$ and $R^2$ may be bonded to different benzene rings. The numbers of these substituents in one molecule are p and q.

Specific examples of the polycarboxylic acid compound or its derivative include, but are not particularly limited to, benzenedicarboxylic acids, such as isophthalic acid, terephthalic acid, 5-allylisophthalic acid, and 2-allylterephthalic acid; benzenetricarboxylic acids, such as trimellitic acid and 5-allyltrimellitic acid; naphthalenedicarboxylic acids, such as naphthalene-1,5-dicarboxylic acid, naphthalene-2,3-dicarboxylic acid, naphthalene-2,6-dicarboxylic acid, naphthalene-2,7-dicarboxylic acid, 3-allylnaphthalene-1,4-dicarboxylic acid, and 3,7-diallylnaphthalene-1,4-dicarboxylic acid; pyridinetricarboxylic acids, such as 2,4,5-pyridinetricarboxylic acid; triazinecarboxylic acids, such as 1,3,5-triazine-2,4,6-tricarboxylic acid; and acid halides thereof. Among these, the polycarboxylic acid compound or its derivative is preferably benzenedicarboxylic acid or benzenetricarboxylic acid, more preferably isophthalic acid, terephthalic acid, isophthaloyl chloride, terephthaloyl chloride, 1,3,5-benzenetricarboxylic acid, or 1,3,5-benzenetricarbonyl trichloride, even more preferably isophthaloyl chloride, terephthaloyl chloride, or 1,3,5-benzenetricarbonyl trichloride.

The polycarboxylic acid compounds or their derivatives may be used alone or in combination of two or more.
(Phenolic Compound)

Specific examples of the phenolic compound include compounds represented by chemical formulae (5-1) to (5-5) below.

In chemical formulae (5-1) to (5-5), each $R^2$ is a polymerizable unsaturated bond-containing substituent. The polymerizable unsaturated bond-containing substituent is the same as described above. Each q is 0 or 1. In the case where a raw material having no polymerizable unsaturated bond-containing substituent is used as a substituent on the aromatic ring of the polycarboxylic acid compound or its derivative and where a single phenolic compound is used as a raw material, the phenolic compound in which q is 1 needs to be used. In the case where a mixture of multiple phenolic compounds are used as a raw material, at least one of them needs to be a compound in which q is 1.

Specific examples of the phenolic compound include, but are not particularly limited to, allylphenols, such as 2-allylphenol, 3-allylphenol, 4-allylphenol, 4-methyl-2-allylphenol, 6-methyl-2-allylphenol, and eugenol; propenylphenols, such as 2-(1-propenyl)phenol and isoeugenol; butenylphenols, such as 2-(3-butenyl)phenol and 2-(1-ethyl-3-butenyl) phenol; and long-chain alkenylphenols, such as cardanol. Among these, the phenolic compound is preferably allylphenol, more preferably 2-allylphenol, 4-methyl-2-allylphenol, or 6-methyl-2-allylphenol, even more preferably 2-allylphenol.

The phenolic compounds described above may be used alone or in combination of two or more.

The amounts of the polycarboxylic acid compound or its derivative and the phenolic compound used are not particularly limited. The ratio by mole of the amount by mole of carboxy groups and/or their derivative groups (for example, acyl halide groups) of the polycarboxylic acid compound or its derivative to the amount by mole of hydroxy groups of the phenolic compound [(carboxy groups and/or their derivative groups)/(hydroxy groups)] is preferably 0.8 to 3.0, more preferably 0.9 to 2.0, even more preferably 1.0 to 1.2.

The reaction conditions are not particularly limited. A known method can be employed as appropriate.

The pH during the reaction is preferably, but not particularly limited to, 11 or more. The adjustment of the pH can be performed by the use of an acid, such as hydrochloric acid, sulfuric acid, nitric acid, or acetic acid, or a base, such as sodium hydroxide, potassium hydroxide, calcium hydroxide, or ammonia.

The reaction temperature is preferably, but not particularly limited to, 20° C. to 100° C., more preferably 40° C. to 80° C.

The reaction pressure is more preferably, but not particularly limited to, atmospheric pressure.

The reaction time is preferably, but not particularly limited to, 0.5 to 10 hours, more preferably 1 to 5 hours.

The maleimide compound (B) used in the present invention may be a compound having a maleimide group in its molecule. The remaining specific structure is not particularly limited, and various compounds can be used. Among these, a compound having two or more maleimide groups in its molecule is preferred because of excellent curability of the curable composition and excellent heat resistance and dielectric properties of the cured product. Specific examples thereof include a bismaleimide compound having two maleimide groups in one molecule and a polymaleimide compound having three or more maleimide groups in one molecule. The maleimide compound (B) may be used alone or in combination of two or more.

Specific examples of the bismaleimide compound include compounds represented by structural formula (6) below:

[Chem. 10]

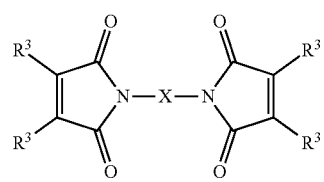

(6)

(where in the formula, X is a divalent organic group, each $R^3$ is any of a hydrogen atom, an aliphatic hydrocarbon group, or a halogen atom, and multiple $R^3$'s present in the formula may be the same or different).

Each $R^3$ in structural formula (6) is any of a hydrogen atom, an aliphatic hydrocarbon group, and a halogen atom. Examples of the aliphatic hydrocarbon group include alkyl groups, such as a methyl group, an ethyl group, a propyl group, a butyl group, a pentyl group, and a hexyl group; cycloalkyl groups, such as a cyclohexyl group; and polymerizable unsaturated bond-containing groups, such as a vinyl group, an allyl group, a propenyl group, an isopropenyl group, and a 1-propenyl group. Examples of the halogen atom include a fluorine atom, a chlorine atom, a bromine atom, an iodine atom.

The specific structure of X in structural formula (6) is not particularly limited and may be any structural moiety. In particular, X is preferably an aromatic ring-containing structural moiety because the resulting curable composition provides a cured product having further excellent heat resistance and dielectric properties. Specific examples of the aromatic ring-containing structural moiety include those represented by any of structural formulae (X-1) to (X-10):

[Chem. 11]

(X-1)

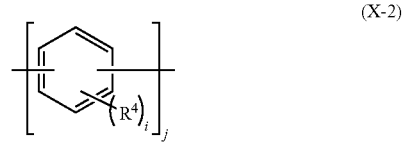

(X-2)

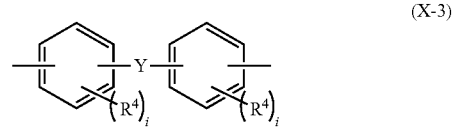

(X-3)

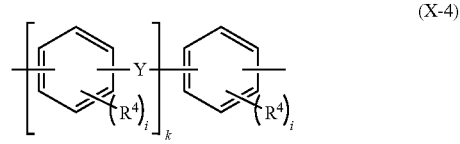

(X-4)

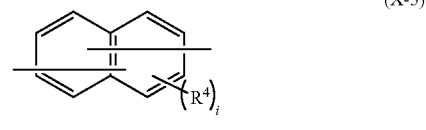

(X-5)

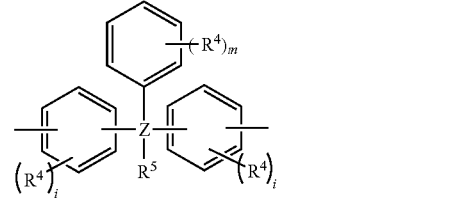

(X-6)

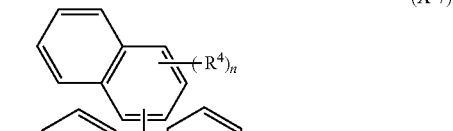

(X-7)

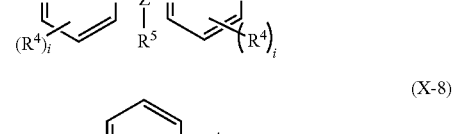

(X-8)

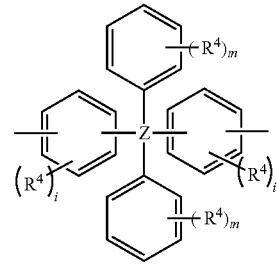

-continued

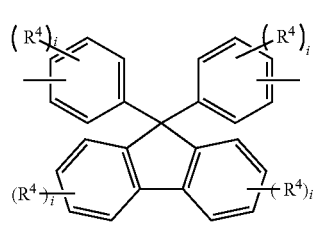

(X-9)

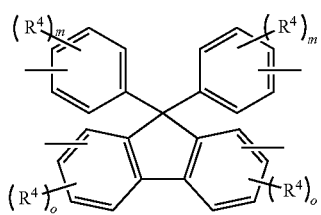

(X-10)

[where in the formulae, each R⁴ is independently any of a polymerizable unsaturated bond-containing group, an alkyl group, an alkoxy group, a halogen atom, an aryl group, and an aralkyl group, each R⁵ is any of a hydrogen atom, an alkyl group, a halogenated alkyl group, and a halogen atom, each Y is any of an alkylene group, a halogenated alkylene group, a carbonyl group, a carbonyloxy group, a sulfonyl group, an oxygen atom, and a sulfur atom, multiple Y's present in formula (X-4) may be the same or different, each Z is a carbon atom or a nitrogen atom, Z in formula (X-8) is, however, a carbon atom, each i is 0 or an integer of 1 to 4, l is 0 or an integer of 1 to 6, each m is 0 or an integer of 1 to 5, n is 0 or an integer of 1 to 7, each o is 0 or an integer of 1 to 3, j and k is each an integer of 2 or more, and the binding sites and the positions of the substituents on the naphthalene rings may be any of the carbon atoms constituting the naphthalene rings].

R⁴ in structural formulae (X-1) to (X-10) is any of a polymerizable unsaturated bond-containing group, an alkyl group, an alkoxy group, a halogen atom, an aryl group, and an aralkyl group. Examples of the polymerizable unsaturated bond in the polymerizable unsaturated bond-containing group include a carbon-carbon double bond and a carbon-carbon triple bond. Specific examples of the polymerizable unsaturated bond-containing group having a carbon-carbon double bond include a vinyl group, a vinyloxy group, a (meth)allyl group, a (meth)allyloxy group, a 1-propenyl group, a 1-butenyl group, a 2-butenyl group, a 3-butenyl group, a 1-hexenyl group, a 2-hexenyl group, a 3-hexenyl group, a 4-hexenyl group, a 5-hexenyl group, a 1-octenyl group, 2-octenyl group, a 1-undecenyl group, a 1-pentadecenyl group, a 3-pentadecenyl group, a 7-pentadecenyl group, a 1-octadecenyl group, a 2-octadecenyl group, a cyclopentenyl group, a cyclohexenyl group, a cyclooctenyl group, a 1,3-butadienyl group, a 1,4-butadienyl group, a hexa-1,3-dienyl group, a hexa-2,5-dienyl group, a pentadeca-4,7-dienyl group, a hexa-1,3,5-trienyl group, a pentadeca-1,4,7-trienyl group, a (meth)acrylic group, a (meth)acryloyloxy group, and a (meth)acryloyloxy(poly) alkyleneoxy group. Specific examples of the group having a carbon-carbon triple bond include an ethynyl group, a propargyl group, a 1-butynyl group, a 2-butynyl group, a 3-butynyl group, a 3-pentynyl group, a 4-pentynyl group, and a 1,3-butadiynyl group.

Examples of the alkyl group include alkyl groups, such as a methyl group, an ethyl group, a propyl group, a butyl group, a pentyl group, and a hexyl group; and cycloalkyl groups, such as a cycloalkyl group. Examples of the alkoxy group include a methoxy group, an ethoxy group, a propyloxy group, and a butoxy group. Examples of the halogen atom include a fluorine atom, a chlorine atom, and a bromine atom. Examples of the aryl group include a phenyl group, a naphthyl group, an anthryl group, and structural moieties in which these aromatic nuclei are each substituted with, for example, the polymerizable unsaturated bond-containing group, an alkyl group, an alkoxy group, or a halogen atom. Examples of the aralkyl group include a benzyl group, a phenylethyl group, a naphthylmethyl group, a naphthylethyl group, and structural moieties in which these aromatic nuclei are each substituted with, for example, the polymerizable unsaturated bond-containing group, an alkyl group, an alkoxy group, or a halogen atom.

Among these, R⁴ is preferably any of a vinyl group, a vinyloxy group, a (meth)allyl group, a (meth)allyloxy group, an alkyl group having 1 to 4 carbon atoms, an alkoxy group having 1 to 4 carbon atoms, a halogen atom, and an aralkyl group having a polymerizable unsaturated bond-containing group because the resulting cured product is excellent in heat resistance and dielectric properties.

Each Y in structural formulae (X-3) and (X-4) is any of an alkylene group, a halogenated alkylene group, a carbonyl group, a carbonyloxy group, a sulfonyl group, an oxygen atom, and a sulfur atom. The number of carbon atoms in each of the alkylene group and the halogenated group is preferably, but not particularly limited to, in the range of 1 to 4.

Preferably, j in structural formula (X-2) is j 2 or 3. Preferably, k in structural formula (X-4) is 2 or 3.

Each R⁵ in structural formulae (X-6) and (X-7) is any of a hydrogen atom, an alkyl group, a halogenated alkyl group, and a halogen atom. The number of carbon atoms in each of the alkyl group and the halogenated alkyl group is preferably, but not particularly limited to, in the range of 1 to 4.

Specific examples of the maleimide compound (B) include compounds represented by structural formulae (6-1) to (6-19) below.

[Chem. 12]

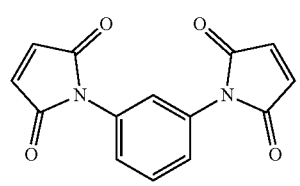

(6-1)

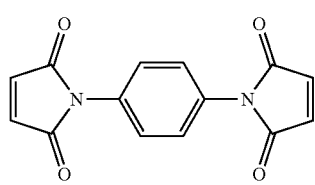

(6-2)

-continued
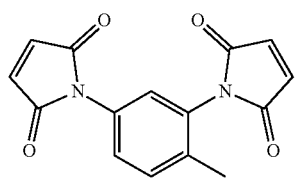
(6-3)
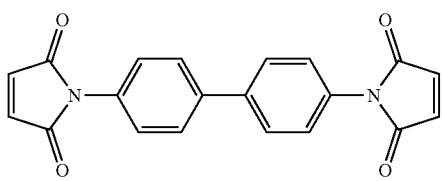
(6-4)
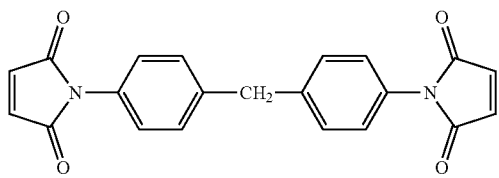
(6-5)
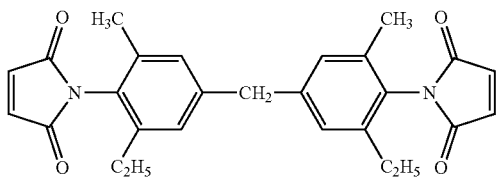
(6-6)
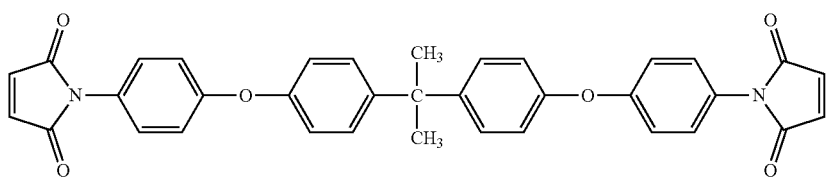
(6-7)
[Chem. 13]
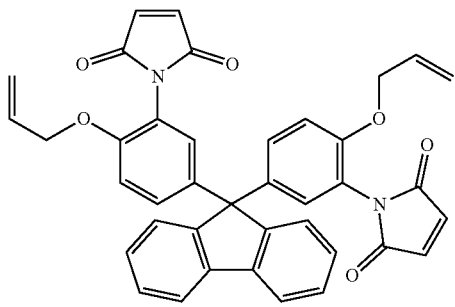
(6-8)
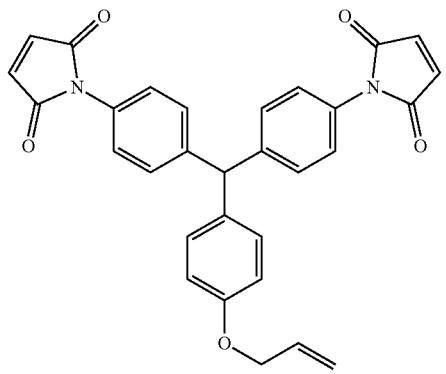
(6-9)
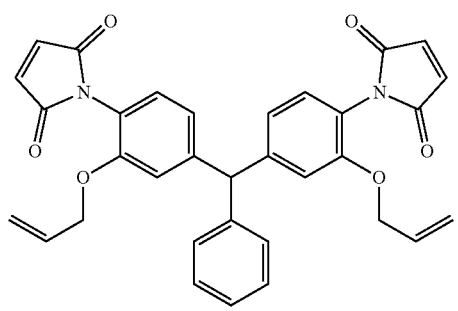
(6-10)
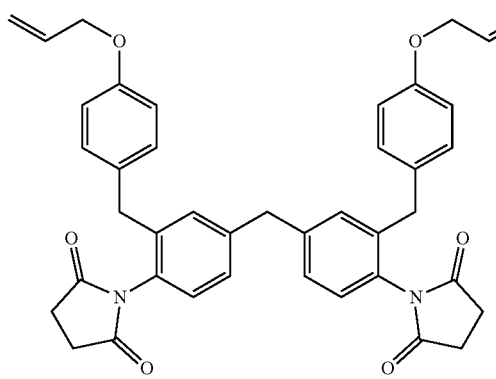
(6-11)
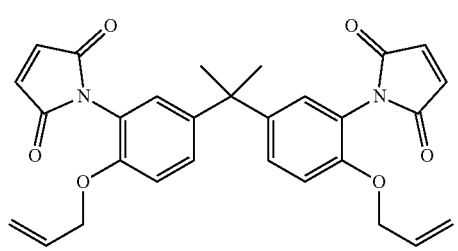
(6-12)
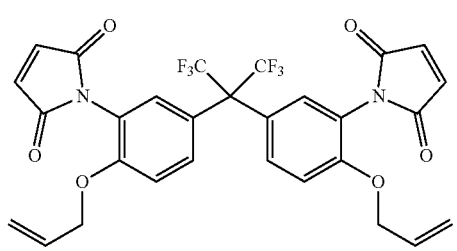
(6-13)

(6-14)
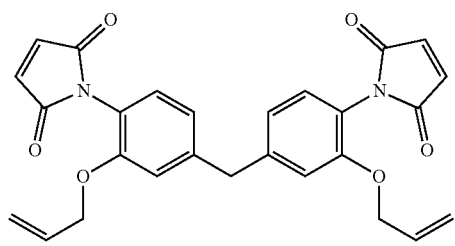

(6-15)
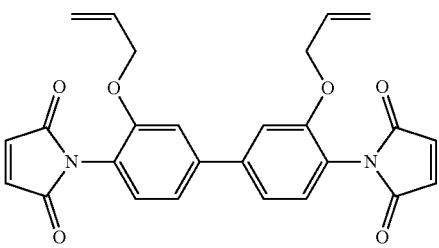

(6-16)
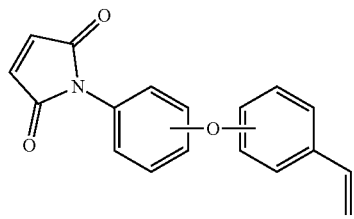

(6-17)
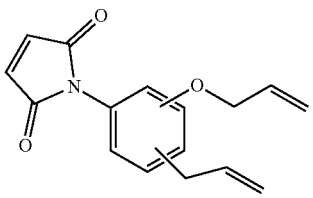

(6-18)
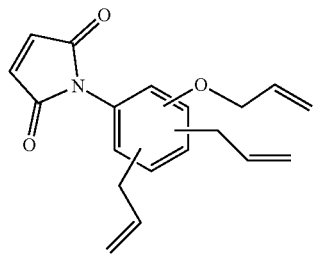

(6-19)
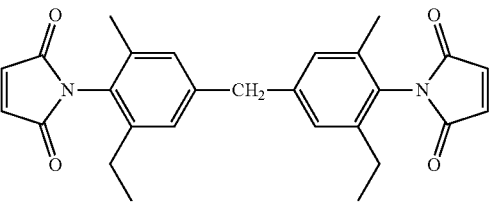

Specific examples of the polymaleimide compound having three or more maleimide groups in one molecule include compounds represented by any of structural formulae (7-1) to (7-3) below.

[Chem. 14]

(7-1)
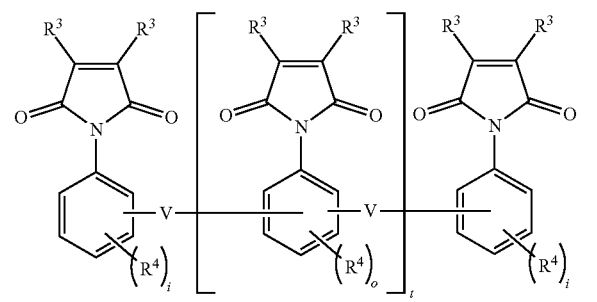

(7-2)
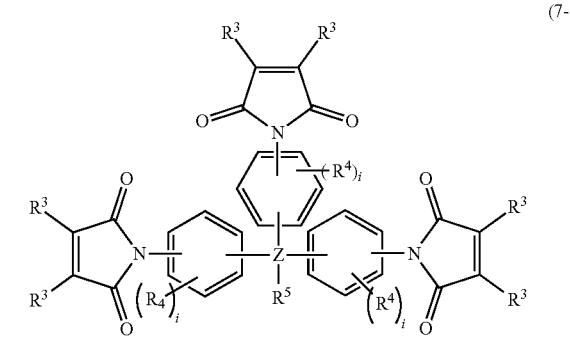

(7-3)
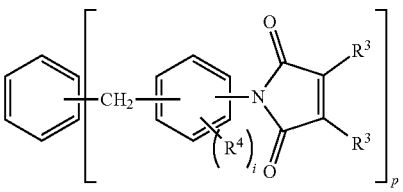

(where in the formulae, each $R^3$ is any of a hydrogen atom, an aliphatic hydrocarbon group, and a halogen atom, multiple $R^3$ present in each of the formulae may be the same or different, each $R^4$ is independently any of a polymerizable unsaturated bond-containing substituent, an alkyl group, an alkoxy group, a halogen atom, an aryl group, and an aralkyl group, each i is 0 or an integer of 1 to 4, o is 0 or an integer of 1 to 3, each V is any of an alkylene group having 1 to 4 carbon atoms, an arylmethylene group, an alkylenearylene-alkylene group, an alkylenebiphenylenealkylene group, a cycloalkylene group, an oxygen atom, a sulfur atom, and a carbonyl group, $R^5$ is any of a hydrogen atom, an alkyl group, a halogenated alkyl group, and a halogen atom, Z is a carbon atom or a nitrogen atom, t is an integer of 2 or more, and p is an integer of 3 to 6).

As these maleimide compounds (B), commercially available compounds may be used as they are. Examples thereof include BMI series (for example, BMI-1000, 2000, 2300, 3000, 4000, 6000, 7000, 8000, and TMH) available from Daiwa Kasei Industry Co., Ltd.; BMI, BMI-70, BMI-80, and so forth, available from K·I Chemical Industry Co., Ltd.; and B1109, N1971, B4807, P0778, P0976, available from Tokyo Chemical Industry Co., Ltd.

Among these maleimide compounds (B), the above-described bismaleimide compounds are preferred from the viewpoint of, for example, the curability and viscosity of the curable composition and the heat resistance and dielectric properties of the cured product. In particular, a maleimide compound in which X in structural formula (6) is any of structural formulae (X-1) to (X-4) is preferred, and a maleimide compound in which X is (X-3) or (X-4) is more preferred.

In the curable composition according to the present invention, the mixing proportions of the aromatic ester compound (A) and the maleimide compound (B) are not particularly limited and are appropriately adjusted in accordance with, for example, desired performance of a cured product. Specifically, the maleimide compound (B) is preferably used in an amount of 10 to 300 parts by mass, more preferably 20 to 200 parts by mass based on 100 parts by mass of the aromatic ester compound (A) because the curable composition provides a cured product having an excellent balance between the heat resistance and the dielectric properties.

The curable composition according to the present invention may contain other components in addition to the aromatic ester compound (A) and the maleimide compound (B). Examples of other components will be described below. Other components that can be contained in the curable composition according to the present invention are not limited to those exemplified below. Components other than those may be contained.

[Other Resin Components]

Specific examples of other resin components include, but are not particularly limited to, polyester resins other than the aromatic ester compound (A), imide resins other than the maleimide compound (B), epoxy resins, phenolic resins, amine compounds, imidazole compounds, acid anhydride, cyanate ester resins, benzoxazine resins, triazine-containing cresol novolac resins, cyanic ester resins, styrene-maleic anhydride resins, ally group-containing resins, such as diallyl bisphenol and triallyl isocyanurate, polyphosphate esters, phosphoric ester-carbonate copolymers, polyphenylene ether resins, and polybutadiene resins. These other resins may be used alone or in combination of two or more.

[Solvent]

In an embodiment, the composition may contain a solvent. The solvent has, for example, the function of adjusting the viscosity of the composition.

Specific examples of the solvent include, but are not particularly limited to, ketones, such as acetone, methyl ethyl ketone, and cyclohexanone; esters, such as ethyl acetate, butyl acetate, cellosolve acetate, propylene glycol monomethyl ether acetate, and carbitol acetate; carbitols, such as cellosolve and butyl carbitol; aromatic hydrocarbons, such as toluene and xylene; and amides, such as dimethylformamide, dimethylacetamide, and N-methylpyrrolidone. These solvents may be used alone or in combination of two or more.

The amount of the solvent used is preferably 10% to 80% by mass, more preferably 20% to 70% by mass based on the total mass of the curable composition. When the amount of the solvent used is 10% or more by mass, good handleability is provided, which is preferred. When the amount of the solvent used is 80% or less by mass, good impregnation properties with another base material are provided, which is preferred.

[Additive]

In an embodiment, the composition may contain an additive. Examples of the additive include curing accelerators, flame retardants, and fillers.

(Curing Accelerator)

Examples of the curing accelerators include, but are not particularly limited to, phosphorus-based curing accelerators, amine-based curing accelerators, imidazole-based curing accelerators, guanidine-based curing accelerators, urea-based curing accelerators, peroxides, and azo compounds.

Examples of the phosphorus-based curing accelerators include, organic phosphine compounds, such as triphenylphosphine, tributylphosphine, tri(p-tolyl)phosphine, diphenylcyclohexylphosphine, and tricyclohexylphosphine; organic phosphite compounds, such as trimethyl phosphite and triethyl phosphite; and phosphonium salts, such as ethyltriphenylphosphonium bromide, benzyltriphenylphosphonium chloride, butylphosphonium tetraphenylborate, tetraphenylphosphonium tetraphenylborate, tetraphenylphosphonium tetra-p-tolylborate, triphenylphosphine-triphenylborane, tetraphenylphosphonium thiocyanate, tetraphenylphosphonium dicyanamide, butylphenylphosphonium dicyanamide, and tetrabutylphosphonium decanoate.

Examples of the amine-based curing accelerators include triethylamine, tributylamine, N,N-dimethyl-4-aminopyridine (DMAP), 2,4,6-tris(dimethylaminomethyl)phenol, 1,8-diazabicyclo[5,4,0]-undecene-7 (DBU), and 1,5-diazabicyclo[4,3,0]-nonene-5 (DBN).

Examples of the imidazole-based curing accelerators include 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, an isocyanuric acid adduct of 2-phenylimidazole, 2-phenyl-4,5-dihydroxymethylimidazole, 2-phenyl-4-methyl-5hydroxymethylimidazole, 2,3-dihydro-1H-pyrrolo[1,2-a]benzimidazole, 1-dodecyl-2-methyl-3-benzylimidazolium chloride, and 2-methylimidazoline.

Examples of the guanidine-based curing accelerators include dicyandiamide, 1-methylguanidine, 1-ethylguanidine, 1-cyclohexylguanidine, 1-phenylguanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-butylbiguanide, 1-cyclohexylbiguanide, 1-allybiguanide, and 1-phenylbiguanide.

Examples of the urea-based curing accelerators include 3-phenyl-1,1-dimethylurea, 3-(4-methylphenyl)-1,1-dimethylurea, chlorophenylurea, 3-(4-chlorophenyl)-1,1-dimethylurea, and 3-(3,4-dichlorophenyl)-1,1-dimethylurea.

Examples of the peroxides and the azo compounds include benzoyl peroxide, p-chlorobenzoyl peroxide, di-tert-butyl peroxide, diisopropyl peroxycarbonate, di-2-ethylhexyl peroxycarbonate, and azobisisobutyronitrile.

Among these curing accelerators, 2-ethyl-4-methylimidazole or dimethylaminopyridine is preferably used.

These curing accelerators described above may be used alone or in combination of two or more.

The amount of the curing accelerator used is preferably 0.01 to 5 parts by mass, more preferably 0.1 to 3 based on 100 parts by mass of the resin solid content of the curable composition. When the amount of the curing accelerator used is 0.01 parts or more by mass, good curability is obtained, which is preferred. When the amount of the curing accelerator used is 5 parts or less by mass, good formability is obtained, which is preferred.

(Flame Retardant)

Examples of the flame retardants include, but are not particularly limited to, inorganic phosphorus-based flame retardants, organic phosphorus-based flame retardants, and halogen-containing flame retardants.

Examples of the inorganic phosphorus-based flame retardants include, but are not particularly limited to, red phosphorus; ammonium phosphates, such as ammonium phosphate monobasic, ammonium phosphate dibasic, ammonium phosphate tribasic, and ammonium polyphosphate; and phosphoramide.

Examples of the organic phosphorus-based flame retardants include, but are not particularly limited to, phosphoric esters, such as methyl acid phosphate, ethyl acid phosphate, isopropyl acid phosphate, dibutyl phosphate, monobutyl phosphate, butoxyethyl acid phosphate, 2-ethylhexyl acid phosphate, bis(2-ethylhexyl)phosphate, monoisodecyl acid phosphate, lauryl acid phosphate, tridecyl acid phosphate, stearyl acid phosphate, isostearyl acid phosphate, oleyl acid phosphate, butyl pyrophosphate, tetracosyl acid phosphate, ethylene glycol acid phosphate, and (2-hydroxyethyl) methacrylate acid phosphate; diphenylphosphines, such as 9,10-dihydro-9-oxa-10-phosphaphenanthrene-10-oxide and diphenylphosphine oxide; phosphorus-containing phenols, such as 10-(2,5-dihydroxyphenyl)-10H-9-oxa-10-phosphaphenanthrene-10-oxide, 10-(1,4-dioxynaphthalene)-10H-9-oxa-10-phosphaphenanthrene-10-oxide, diphenylphosphinyl hydroquinone, diphenylphosphenyl-1,4-dioxynaphthalene, 1,4-cyclooctylenephosphinyl-1,4-phenyldiol, and 1,5-cyclooctylenephosphinyl-1,4-phenyldiol; cyclic phosphorus compounds, such as 9,10-dihydro-9-oxa-10-phosphaphenanthrene-10-oxide, 10-(2,5-dihydrooxyphenyl)-10H-9-oxa-10-phosphaphenanthrene-10-oxide, and 10-(2,7-dihydrooxynaphthyl)-10H-9-oxa-10-phosphaphenanthrene-10-oxide; and compounds obtained by reacting the phosphoric esters, the diphenylphosphines, or the phosphorus-containing phenols with epoxy resins, aldehyde compounds, or phenol compounds.

Examples of the halogen-containing flame retardants include, but are not particularly limited to, brominated polystyrene, bis(pentabromophenyl)ethane, tetrabromobisphenol A bis(dibromopropyl ether), 1,2-bis(tetrabromophthalimide), 2,4,6-tris(2,4,6-tribromophenoxy)-1,3,5-triazine, and tetrabromophthalic acid.

These flame retardants described above may be used alone or in combination of two or more.

The amount of the flame retardant used is preferably 0.1 to 50 parts by mass, more preferably 1 to 30 based on 100 parts by mass of the resin solid content of the curable composition. When the amount of the flame retardant used is 0.1 parts or more by mass, flame retardancy can be imparted, which is preferred. When the amount of the flame retardant used is 50 parts or less by mass, flame retardancy can be imparted while maintaining the dielectric properties, which is preferred.

Examples of the fillers include organic fillers and inorganic fillers. The fillers have, for example, the functions of improving elongation and mechanical strength.

Examples of the organic fillers include, but are not particularly limited to, polyamide particles.

Examples of the inorganic fillers include, but are not particularly limited to, silica, alumina, glass, cordierite, silicon oxide, barium sulfate, barium carbonate, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium zirconate titanate, barium zirconate, calcium zirconate, zirconium phosphate, zirconium phosphate tungstate, talc, clay, mica powder, zinc oxide, hydrotalcite, boehmite, and carbon black.

Among these, silica is preferably used. In this case, Examples of silica that can be used include amorphous silica, fused silica, crystalline silica, synthetic silica, and hollow silica.

The fillers described above may be surface-treated as needed. Examples of a surface treatment agent that can be used in this case include, but are not particularly limited to, aminosilane-based coupling agents, epoxysilane-based coupling agents, mercaptosilane-based coupling agents, silane-based coupling agents, organosilazane compounds, and titanate-based coupling agents. Specific examples of the surface treatment agents include 3-glycidoxypropyltrimethoxysilane, 3-mercaptopropyltrimethoxysilane, 3-aminopropyltriethoxysilane, N-phenyl-3-aminopropyltrimethoxysilane, and hexamethyldisilazane.

These fillers described above may be used alone or in combination of two or more.

The average particle size of each of the fillers is preferably, but is not particularly limited to, 0.01 to 10 m, more preferably 0.03 to 5 m, even more preferably 0.05 to 3 µm. In the present specification, the "particle size" refers to the maximum distance between two points on the outline of a particle. The "average particle size" refers to a value obtained by a method including measuring the particle sizes of freely-selected 100 particles on one screen in an image with a scanning electron microscope (SEM) and calculating the average value thereof.

The amount of the filler used is preferably 0.5 to 95 parts by mass, more preferably 5 to 80 parts by mass based on 100 parts by mass of the resin solid content of the curable composition. When the amount of the filler used is 0.5 parts or more by mass, low thermal expansion can be provided, which is preferred. When the amount of the filler used is 95 parts or less by mass, a good balance between characteristics and formability is provided, which is preferred.

<Cured Product (Cured Product of Curable Composition)>

According to an embodiment of the present invention, a cured product obtained by curing the curable composition containing the aromatic ester compound (A) and the maleimide compound (B) is provided.

The aromatic ester compound (A) described above has a polymerizable unsaturated bond-containing substituent and thus can be polymerized by itself to provide a cured product.

The cured product may contain the curing agent, the additive, the curing accelerator, and so forth as needed.

The aromatic ester compound (A) itself has a low dielectric loss tangent; hence, the resulting cured product thereof has a low dielectric loss tangent and higher heat resistance. Thus, the cured product can be used for electronic material applications, such as semiconductor package substrates, printed wiring boards, build-up adhesive films, and semiconductor sealing materials. Additionally, it can also be used for applications, such as adhesives and paints.

The heating temperature for heat curing is preferably, but not particularly limited to, 150° C. to 300° C., more preferably 175° C. to 250° C.

EXAMPLES

While the present invention will be described below with reference to examples, the present invention is not limited to the description of these examples.

Production Example 1: Production of Aromatic Ester Compound (A-1)

Into a flask equipped with a thermometer, a dropping funnel, a condenser, a fractionating column, and a stirrer, 268 g of o-allylphenol and 1,200 g of toluene were charged. The contents were dissolved while the system was reduced in pressure and filled with nitrogen. Next, 203 g of isophthaloyl chloride was added thereto. The contents were dissolved while the system was reduced in pressure and filled with nitrogen. Then 0.6 g of tetrabutylammonium bromide was added thereto and dissolved. The system was controlled to 60° C. or lower while nitrogen gas purging was performed, and 412 g of a 20% aqueous solution of sodium hydroxide was added dropwise thereto over a period of 3 hours. After the dropwise addition, stirring was continued for 1 hour under the same temperature. The reaction mixture was allowed to stand and separated into two phases. The aqueous layer was removed. Water was added to the resulting organic layer. The mixture was stirred for about 15 minutes, allowed to stand, and separated into two phases. The aqueous layer was removed. This washing operation with water was repeated until the pH of the aqueous layer reached 7. The organic layer after the washing with water was evaporated by heating under reduced pressure to give 370 g of an aromatic ester compound (A-1) represented by the following structural formula. The aromatic ester compound (A-1) had an ester equivalent of 199 g/eq., an allyl equivalent of 199 g/eq, and an E-type viscosity of 6,000 mPa·s (25° C.).

[Chem. 15]

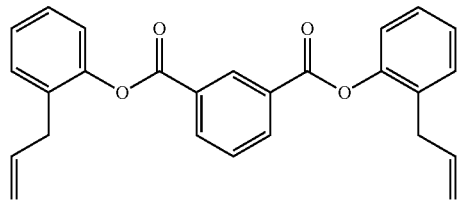

Comparative Production Example 1: Production of Aromatic Ester Compound (A')

Into a flask equipped with a thermometer, a dropping funnel, a condenser, a fractionating column, and a stirrer, 165 g of a resin (hydroxyl equivalent: 165 g/eq., softening point: 85° C.) obtained by the polyaddition reaction of dicyclopentadiene and phenol, 72 g of 1-naphthol, and 630 g of toluene were charged. The contents were dissolved while the system was reduced in pressure and filled with nitrogen. Next, 152 g of isophthaloyl chloride was added thereto and dissolved while the system was reduced in pressure and filled with nitrogen. Then 0.6 g of tetrabutylammonium bromide was added thereto. The system was controlled to 60° C. or lower while nitrogen gas purging was performed, 315 g of a 20% aqueous solution of sodium hydroxide was added dropwise thereto over a period of 3 hours. After the dropwise addition, stirring was continued for 1 hour under the same temperature. The reaction mixture was allowed to stand and separated into two phases. The aqueous layer was removed. Water was added to the resulting organic layer. The mixture was stirred for about 15 minutes, allowed to stand, and separated into two phases. The aqueous layer was removed. This washing operation with water was repeated until the pH of the aqueous layer reached 7. The organic layer after the washing with water was evaporated by heating under reduced pressure to give an aromatic ester compound (A'). The aromatic ester compound (A') had an ester equivalent of 223 g/eq. and a softening point of 150° C.

Example 1 and Comparative Example 1

Components were mixed in proportions given in Table 1 to prepare curable compositions. With respect to the resulting curable compositions, the evaluation of the heat resistance and the measurement the dielectric loss tangent of each of the resulting cured products were performed. Table 1 presents the results.

Details of the components are described below.

Maleimide compound (B-1): 4,4'-diphenylmethane bismaleimide ("BMI-1000", available from Daiwakasei Industry Co., Ltd., maleimide equivalent: 179 g/eq.)

Epoxy resin: bisphenol A-type epoxy resin ("EPICLON 850S", available from DIC Corporation, epoxy equivalent: 188 g/eq.)

Production of Cured Product

Each of the curable compositions was poured into a mold measuring 11 cm×9 cm×2.4 mm and molded with a pressing machine at 150° C. for 60 minutes, then at 175° C. for 90 minutes, and then at 200° C. for 90 minutes. The molded article was removed from the mold and further cured at 230° C. for 4 hours to provide a cured product.

Evaluation of Heat Resistance (Measurement of Glass Transition Temperature)

A test piece having a width of 5 mm and a length of 54 mm was cut out from the 2.4-mm-thick cured product obtained above. The test piece was subjected to dynamic mechanical analysis (DMA) using a rectangular tension method with an RSA II solid viscoelasticity measuring instrument, available from Rheometric Scientific, to measure the temperature at which the maximum change in elastic modulus (the maximum rate of change of tan δ) was obtained as a glass transition temperature. The measurement conditions were as follows: a frequency of 1 Hz and a rate of temperature increase of 3° C./min.

Measurement of Dielectric Loss Tangent

The cured product obtained above was vacuum-dried by heating at 105° C. for 2 hours and then stored in a room at a temperature of 23° C. and a humidity of 50% for 24 hours to provide a test piece. The dielectric loss tangent of the test piece was measured at 1 GHz by a resonant cavity method with an "E8362C network analyzer", available from Agilent Technologies, Inc.

TABLE 1

|  | Example 1 | Comparative example 1 |
|---|---|---|
| Aromatic ester compound (A-1) [parts by mass] | 52.7 |  |
| Aromatic ester compound (A') [parts by mass] |  | 54.3 |
| Maleimide compound (B-1) [parts by mass] | 47.4 |  |
| Epoxy resin [parts by mass] |  | 45.7 |

TABLE 1-continued

|  | Example 1 | Comparative example 1 |
|---|---|---|
| Dimethylaminopyridine [parts by mass] |  | 0.5 |
| Dicumyl peroxide [parts by mass] | 1 |  |
| Heat resistance | 350° C. or higher | 157° C. |
| Dielectric loss tangent | 0.0038 | 0.0080 |

The invention claimed is:

1. A curable composition, comprising:

an aromatic ester compound (A) and a maleimide compound (B), the aromatic ester compound (A) being represented by structural formula (1-1):

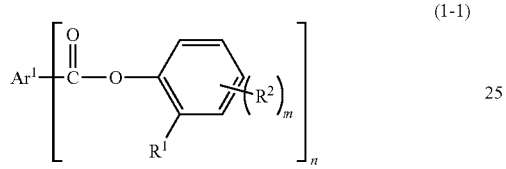
(1-1)

where in the formula, $Ar^1$ is a substituted or unsubstituted aromatic ring group, each $R^1$ is a polymerizable unsaturated bond-containing substituent, each $R^2$ is any of an alkyl group, an alkoxy group, an alkyloxycarbonyl group, an alkylcarbonyloxy group, and a halogen atom, each m is 0 or an integer of 1 to 4, and n is 2 or 3;

and the maleimide compound (B) being compound having two or more maleimide groups in one molecule;

and wherein the aromatic ring group of AO has the formula:

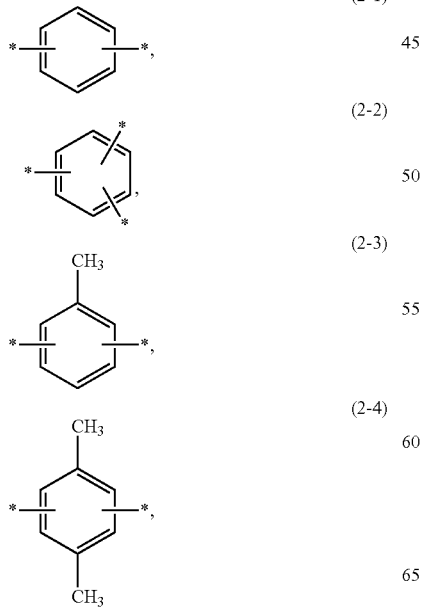

(2-1)

(2-2)

(2-3)

(2-4)

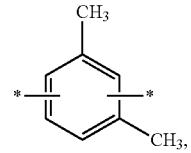
(2-5)

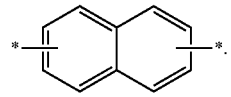
(2-6)

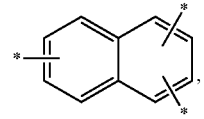
(2-7)

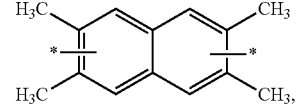
(2-8)

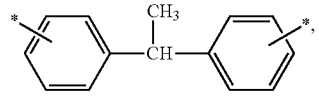
(2-10)

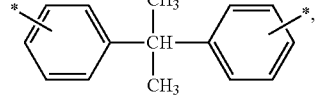
(2-11)

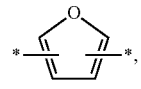
(2-12)

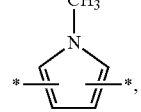
(2-13)

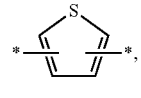
(2-14)

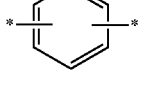
(2-15)

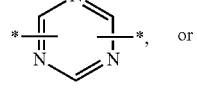
(2-16)

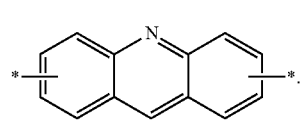
(2-17)

2. A cured product of the curable composition according to claim 1.

3. A printed wiring board obtained using the curable composition according to claim 1.

4. A semiconductor sealing material obtained using the curable composition according to claim 1.

5. A build-up film obtained using the curable composition according to claim 1.

* * * * *